United States Patent
Park

(10) Patent No.: US 8,247,885 B2
(45) Date of Patent: Aug. 21, 2012

(54) SEMICONDUCTOR DEVICE HAVING CAPACITORS FIXED TO SUPPORT PATTERNS AND METHOD FOR MANUFACTURING THE SAME

(75) Inventor: Sung Min Park, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 399 days.

(21) Appl. No.: 12/261,464

(22) Filed: Oct. 30, 2008

(65) Prior Publication Data

US 2009/0243037 A1 Oct. 1, 2009

(30) Foreign Application Priority Data

Apr. 1, 2008 (KR) .................. 10-2008-0030345

(51) Int. Cl.
*H01L 27/10* (2006.01)
(52) U.S. Cl. ................. 257/534; 257/E27.071
(58) Field of Classification Search .................. 257/532, 257/534, E27.071, E21.014–E21.017
See application file for complete search history.

(56) References Cited

U.S. PATENT DOCUMENTS

| 6,838,341 | B2 * | 1/2005 | Yoon et al. | 438/255 |
| 2006/0003582 | A1 * | 1/2006 | Roh | 438/675 |
| 2006/0033137 | A1 * | 2/2006 | Lee et al. | 257/296 |
| 2006/0189064 | A1 * | 8/2006 | Shim et al. | 438/210 |

FOREIGN PATENT DOCUMENTS

| KR | 1020040059895 A | 7/2004 |
| KR | 10-0449030 B1 | 9/2004 |
| KR | 10-0524810 B1 | 7/2005 |
| KR | 1020060135192 A | 12/2006 |

* cited by examiner

*Primary Examiner* — Minh-Loan T Tran
*Assistant Examiner* — Wensing Kuo
(74) *Attorney, Agent, or Firm* — Ladas & Parry LLP

(57) ABSTRACT

A semiconductor device containing a cylindrical shaped capacitor and a method for manufacturing the same is presented. The semiconductor device includes a plurality of storage nodes and a support pattern. The plurality of storage nodes is formed over a semiconductor substrate. The support pattern is fixed to adjacent storage nodes in which the support pattern has a flowable insulation layer buried within the support pattern. The buried flowable insulation layer direct contacts adjacent storage nodes.

6 Claims, 7 Drawing Sheets

SEMICONDUCTOR DEVICE HAVING CAPACITORS FIXED TO SUPPORT PATTERNS AND METHOD FOR MANUFACTURING THE SAME

CROSS-REFERENCE TO RELATED APPLICATIONS

The present application claims priority to Korean patent application number 10-2008-0030345 filed on Apr. 1, 2008, which is incorporated herein by reference in its entirety.

BACKGROUND OF THE INVENTION

The present invention relates generally to semiconductor devices and methods for manufacturing the same, and more particularly, to semiconductor devices that can prevent or at least minimize the occurrence of cracks and alike from occurring between a support pattern and storage nodes and methods for manufacturing the same.

The demand for high performance semiconductor memory devices continues to rapidly increase. Accordingly, various techniques for obtaining small capacitors that have high capacitance are in demand. The fundamentals of exactly what is required to make a capacitor are relatively simple. A capacitor is an electronic structure that has a dielectric interposed between storage nodes and plate nodes. The capacitance of the capacitor is understood to be proportional to the surface area of an electrode and the dielectric constant of the dielectric and is inversely proportional to the distance between electrodes, that is, the thickness of the dielectric.

In order to obtain a capacitor having high capacitance, it is necessary to use a dielectric having high dielectric constant, increase the surface area of an electrode, or decrease the distance between electrodes. In this regard, physical limitations or barriers exist when trying to decrease the distance between electrodes. That is, the thickness of the dielectric can only be so thin until non-insulative breakthrough will occur. Therefore, advancements in forming small capacitors having high capacitance is mainly directed toward either using dielectric materials that have relatively high dielectric constants or increasing the surface area of the opposing electrodes.

One promising option to achieve a micro sized capacitor having a high capacity is to increase the surface area of an electrode along a three-dimensional configuration instead of being restricted to a two-dimensional scheme. Some popular three-dimensional schemes include concave and cylindrical geometric shapes. Cylindrical capacitors exhibit much larger electrode surface areas as compared to the concave type capacitors. Therefore, cylinder type capacitors promise to provide a number of advantages when applied to highly integrated semiconductor devices.

However, a number of difficulties in fabricating micro sized cylindrical capacitors can occur. In particular, forming the cylindrical type capacitors using a dip-out process to remove the mold insulation layer that serves as a mold for forming storage nodes can result in compromising the integrity (i.e., cracks and alike) of the resultant micro-sized cylindrical capacitors. As the size of cells decreases, the aspect ratio of the storage nodes increases, and the adjacent space between storage nodes becomes narrower. As a result of conducting the dip-out process, these micro-sized cylindrical capacitors are prone to leaning. Under these circumstances, a method of forming support patterns for fixing or buttressing the storage nodes has been proposed in the art.

Hereinbelow, a conventional method for manufacturing a semiconductor device having cylinder type capacitors will be briefly described.

After forming an interlayer dielectric over a semiconductor substrate, storage node contact plugs are formed in the interlayer dielectric. After forming a mold insulation layer for forming storage nodes on the interlayer dielectric including the storage node contact plugs, a nitride layer for supporting storage nodes is formed on the mold insulation layer. By selectively etching the nitride layer for supporting storage nodes and the mold insulation layer, holes for storage nodes are defined to expose the storage node contact plugs.

After forming storage nodes on the surfaces of the holes for storage nodes, by selectively patterning the nitride layer for supporting storage nodes and the mold insulation layer, support patterns for fixing the storage nodes are formed. Then, a dip-out process is conducted to remove the mold insulation layer having served as a mold for forming the storage nodes. At this time, the support patterns function to prevent the storage nodes from leaning. Next, by sequentially forming a dielectric layer and plate nodes on the storage nodes, cylinder type capacitors are completely formed.

However, in the conventional art as described above, the stress induced when conducting the dip-out process and subsequently forming the dielectric layer to the support patterns contributes to cracks between the support patterns and the storage nodes. As a result, leakage of capacitance is can result which degrades the operational characteristics of a semiconductor devices.

SUMMARY OF THE INVENTION

Embodiments of the present invention are directed to a semiconductor device that can prevent or at least minimize the occurrence of cracks and alike from occurring between the support pattern and the storage nodes. Embodiments of methods for manufacturing the same are also presented.

Also, embodiments of the present invention are directed to a semiconductor device that can prevent or minimize leakage of the resultant capacitor semiconductor device. Thereby the embodiments of the present invention contribute to improving the operational characteristics of these types of capacitor semiconductor devices.

One embodiment of the present invention of the semiconductor device comprises a plurality of storage nodes formed over a semiconductor substrate; and a support pattern fixed to the storage nodes in which the support pattern has a structure that contains a flowable insulation layer inserted within it.

The storage nodes are formed to directly contact the flowable insulation layer inserted within the support pattern.

The flowable insulation layer may comprise any flowable insulation material such as those selected from the group consisting of a BPSG and a PSG.

The flowable insulation layer is inserted within the support pattern so that flowable insulation layer is substantially sequestered within the support pattern except for contacting the storage nodes.

The support pattern may comprise any support pattern material such as being composed of a nitride layer.

In another embodiment of the present invention, a method for manufacturing a semiconductor device is presented that comprises the steps of forming an insulation layer over a semiconductor substrate; forming support layers on the insulation layer in which the support layer includes a flowable insulation layer inserted within the support layer; defining a plurality of holes by etching through the support layers and into the insulation layer; forming cylinder type storage nodes in the respective holes; etching selectively the support layer to form a support pattern that fixes onto the storage nodes in which the support pattern has a resultant structure that sequesters the flowable insulation layer in which the buried flowable insulation layer of the support pattern does directly contact adjacent storage nodes; and removing any remaining exposed insulation layer after forming the support pattern.

The step of forming the support layers comprises the steps of forming a first support layer on the insulation layer; forming a flowable insulation layer on the first support layer; and forming a second support layer on the flowable insulation layer and on the first support layer.

The first and second support layers comprise nitride layers.

The step of forming the flowable insulation layer comprises the steps of forming a flowable insulation layer on the first support layer; and etching the flowable insulation layer to expose a portion of the first support layer.

The flowable insulation layer comprises at least one of a BPSG layer and a PSG layer.

Adjacent storage nodes are formed to directly contact the flowable insulation layer inserted, buried or sandwiched within the support pattern.

The step of forming the support pattern comprises the steps of forming a capping layer on the support layers and on the storage nodes; forming a mask pattern on the capping layer to form a support pattern; etching the capping layer using the mask pattern as an etch mask to expose portions of the support layers; removing the exposed portions of the support layers; removing the mask pattern; and removing the capping layer.

The capping layer comprises an oxide layer.

The step of removing the capping layer is implemented through a dip-out process.

The step of forming the support pattern is implemented such that the flowable insulation layer is not exposed out of the support pattern.

BRIEF DESCRIPTION OF THE DRAWINGS

FIGS. 3A through 33 are cross-sectional views taken in correspondence to the line A-A' of FIG. 1, illustrating the processes of a method for manufacturing a semiconductor device in accordance with another embodiment of the present invention.

DESCRIPTION OF SPECIFIC EMBODIMENTS

Hereafter, specific embodiments of the present invention will be described in detail with reference to the accompanying drawings.

Figure 1:
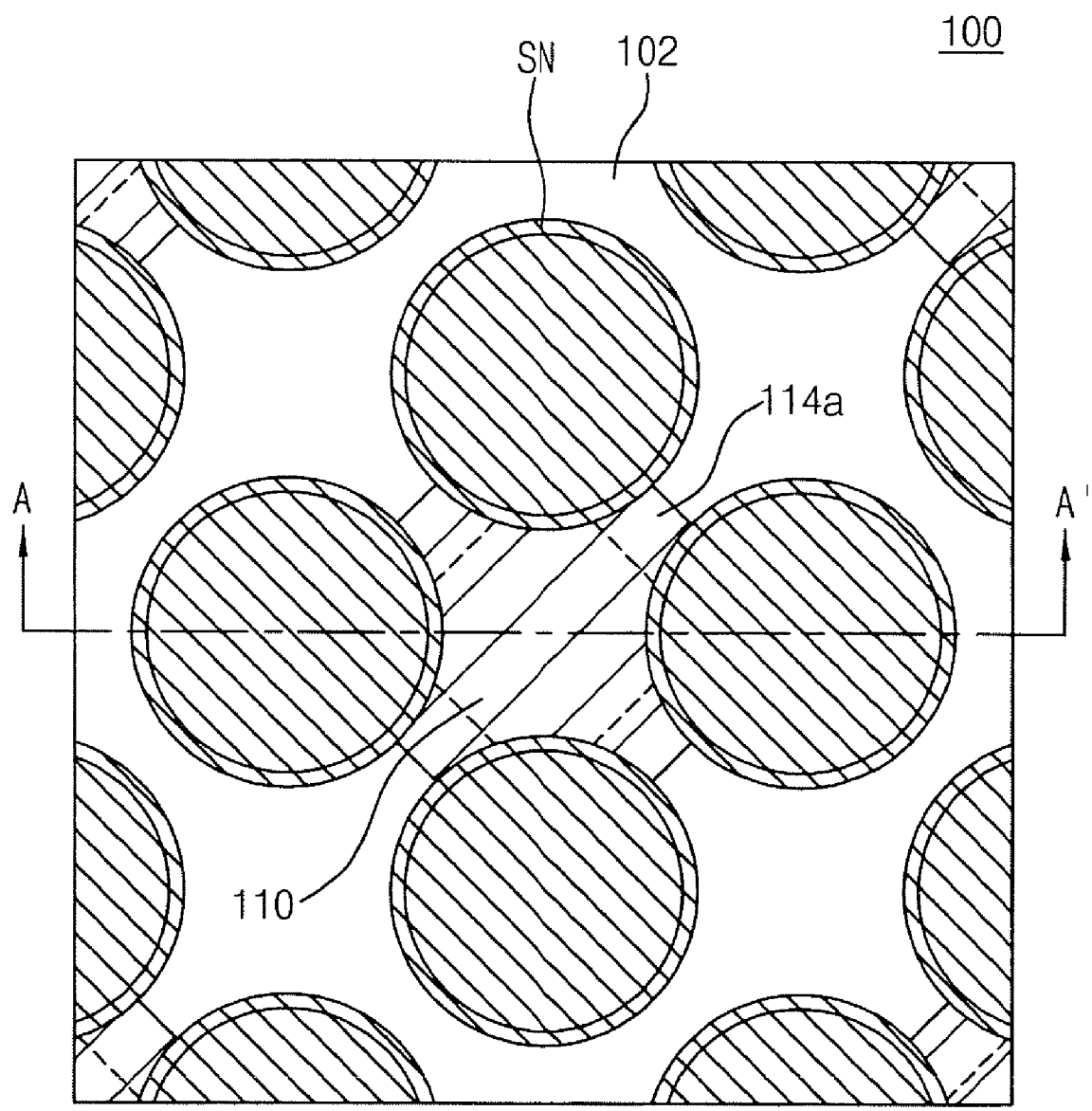
FIG. 1 is a plan view showing a semiconductor device in accordance with one embodiment of the present invention.

FIG. 1 is a plan view showing a semiconductor device in accordance with one embodiment of the present invention.

Referring to FIG. 1, an interlayer dielectric 102 is formed over a semiconductor substrate 100, and a plurality of cylinder type storage nodes SN are formed on the interlayer dielectric 102. Support patterns 114a are formed to fix or buttress together adjacent storage nodes SN. Each support pattern 114a has a structure in which a flowable insulation layer 110 for contacting the storage nodes SN is inserted.

Figure 2:
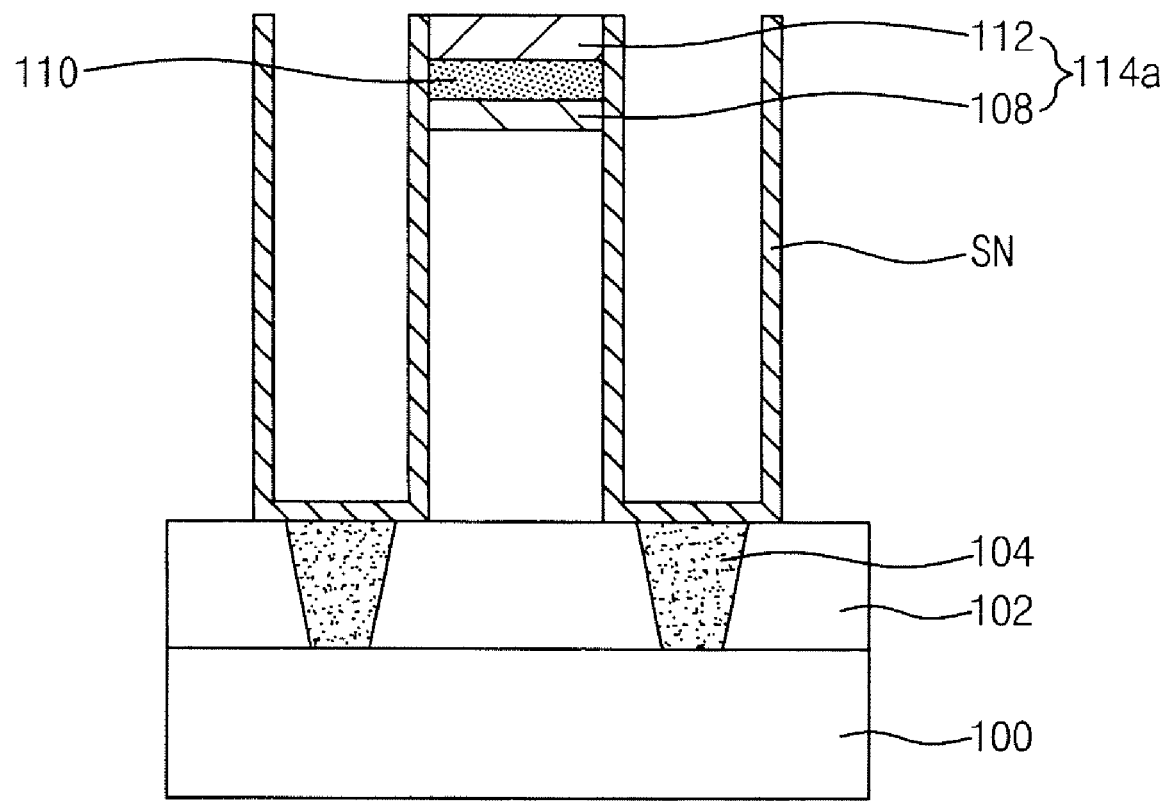
FIG. 2 is a cross-sectional view taken along the line A-A' of FIG. 1, illustrating the semiconductor device in accordance with one embodiment of the present invention.

FIG. 2 is a sectional view taken along the line A-A' of FIG. 1, illustrating the semiconductor device in accordance with one embodiment of the present invention.

Referring to FIG. 2, the interlayer dielectric 102 is formed over the semiconductor substrate 100, and a plurality of storage node contact plugs 104 is formed in the interlayer dielectric 102. The plurality of cylinder type storage nodes SN is formed on the plurality of storage node contact plugs 104. The support patterns 114a for fixing together adjacent storage nodes SN are formed on the semiconductor substrate 100 and are formed to interconnect together adjacent storage nodes SN.

Here, each support pattern 114a has the structure in which the flowable insulation layer 110 is inserted between a first support layer 108 and a second support layer 112. The first and second support layers 108 and 112 comprise nitride layers, and the flowable insulation layer 110 comprises at least one of a BPSG (borophosphosilicate glass) layer and a PSG (phosphosilicate glass) layer. Also, other than the flowable insulation layer 110 contacting adjacent storage nodes SN, the flowable insulation layer 110 is not exposed beyond the bounds of each corresponding support pattern 114a.

Therefore, the semiconductor device according to the present embodiments has support patterns 114a that fix or buttress the storage nodes SN, whereby the leaning phenomenon of the storage nodes SN can be prevented or at least reduced. Moreover, in the present embodiments of the invention, since the support pattern 114a has an internally inserted flowable insulation layer 110, then even when cracks or other imperfections may occur between the storage nodes SN and the support pattern 114a in a subsequent process, the flowable insulation layer 110 can subsequently fill in these cracks and other imperfections. Accordingly, in the present invention, the leakage of capacitance due to the presence of the cracks can be prevented or at least reduced. Through these embodiments improved characteristics of a semiconductor device can be accomplished.

FIGS. 3A through 3J are sectional views taken in correspondence to the line A-A' of FIG. 1, illustrating the processes of a method for manufacturing a semiconductor device in accordance with another embodiment of the present invention.

Figure 3A:
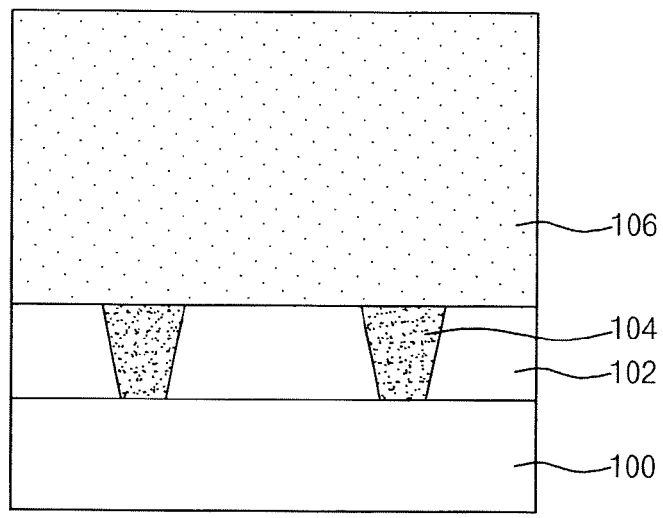

Referring to FIG. 3A, after forming an interlayer dielectric 102 over a semiconductor substrate 100, contact holes are defined by etching the interlayer dielectric 102. After forming a conductive layer (not shown), for example a polysilicon layer, to fill the contact holes, by etching back the conductive layer, storage node contact plugs 104 are formed in the contact holes. A mold insulation layer 106 is then formed on the interlayer dielectric 102 and on the storage node contact plugs 104. The mold insulation layer 106 comprises, for example, an oxide layer.

Figure 3B:
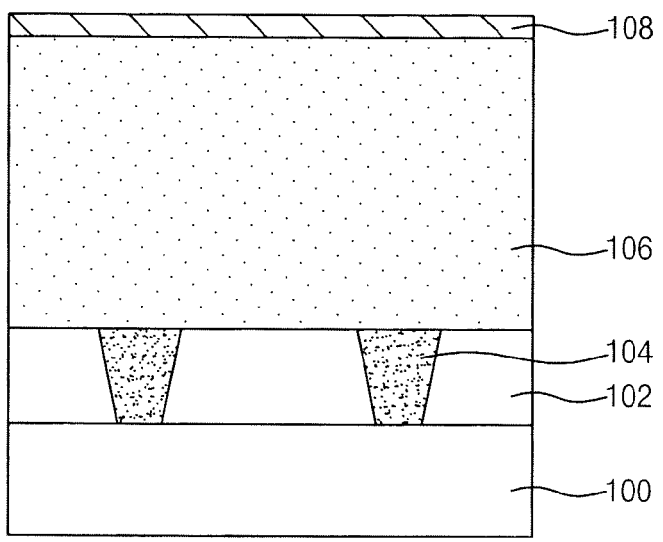

Referring to FIG. 3B, a first support layer 108 is shown formed on the mold insulation layer 106. The first support layer 108 may comprise, for example, a nitride layer.

Figure 3C:
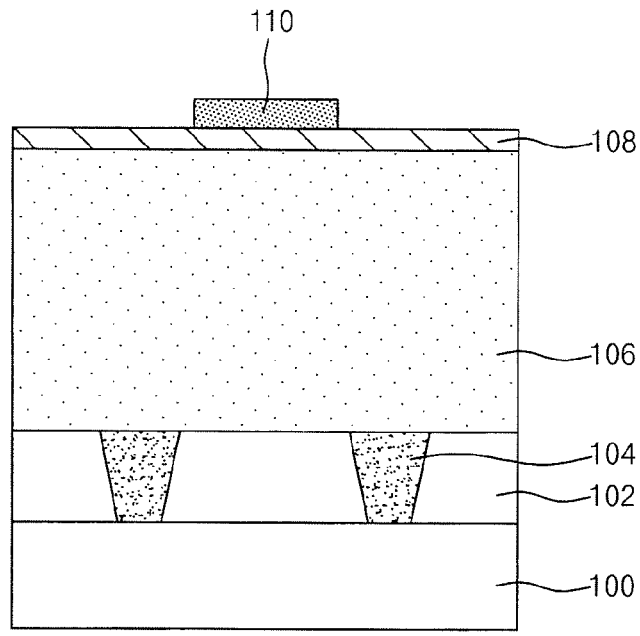

Referring to FIG. 3C, a flowable insulation layer (not shown) is then formed on the first support layer 108. The flowable insulation layer comprises preferably at least one of a BPSG layer and a PSG layer. Then, by etching the flowable insulation layer to expose a portion of the first support layer 108, a flowable insulation layer 110 is subsequently formed on the first support layer 108. One embodiment is that the flowable insulation layer 110 may have the shape of a quadrangle when viewed from the top.

Figure 3D:
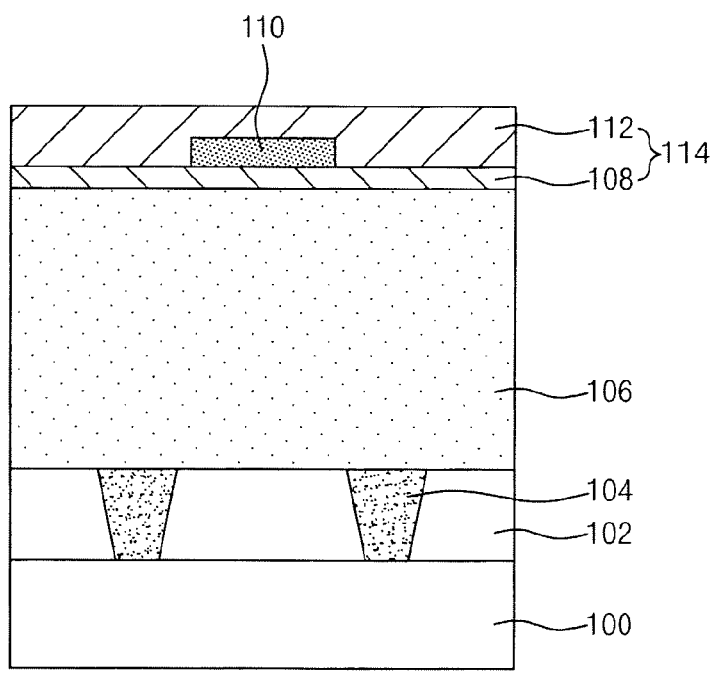

Referring to FIG. 3D, a second support layer 112 is shown formed on the flowable insulation layer 110 and on the first support layer 108. One embodiment of the second support layer 112 may comprise, for example, a nitride layer which is formed to completely cover the flowable insulation layer 110 such that the flowable insulation layer 110 is not exposed, i.e., buried within the first and second support layers 108, 110. As a result, a support layer 114 is formed to have a structure in which the flowable insulation layer 110 is inserted in the support layer 114 on the mold insulation layer 106.

Figure 3E:
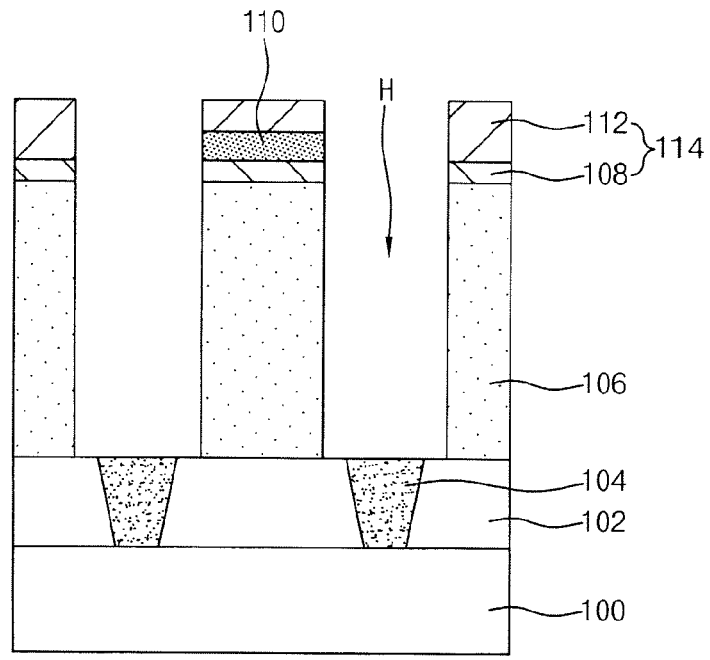

Referring to FIG. 3E, by etching the support layer 114 having the flowable insulation layer 110 inserted therein and the mold insulation layer 106, a plurality of holes H for storage nodes are defined. The holes H for storage nodes are defined to expose the storage node contact plugs 104.

Figure 3F:
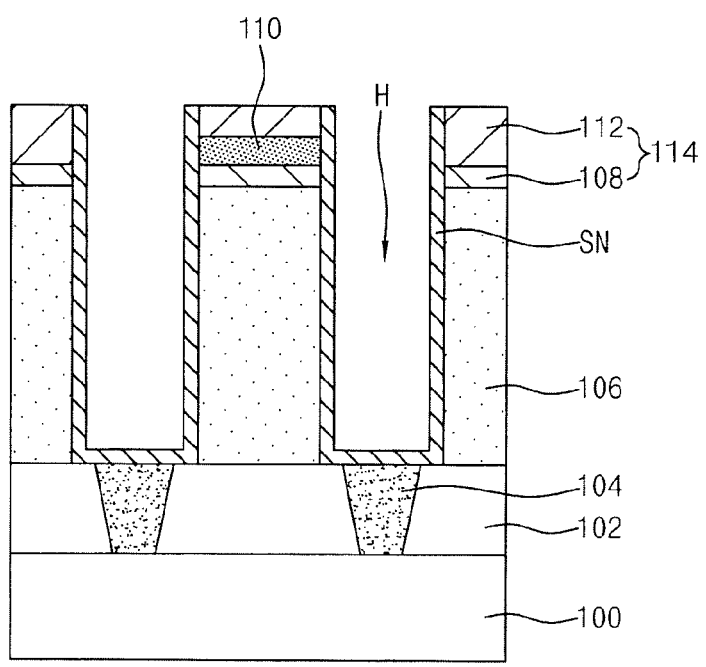

Referring to FIG. 3F, a conductive layer (not shown) for fabricating storage nodes is formed on the support layer 114 and on the surfaces of the holes H for storage nodes. Some preferred embodiments of the conductive layer for storage nodes comprise, for example, a single layer of a TiN layer or a Ti layer or a stack layer of the TiN layer and the Ti layer. By removing portions of the conductive layer for storage nodes formed on the support layer 114, such as through CMP (chemical mechanical polishing) or an etch-back process, cylinder type storage nodes SN are subsequently formed in the holes H for storage nodes. Here, the storage nodes SN are shown formed contacting the flowable insulation layer 110 which is inserted in the support layer 114.

Figure 3G:
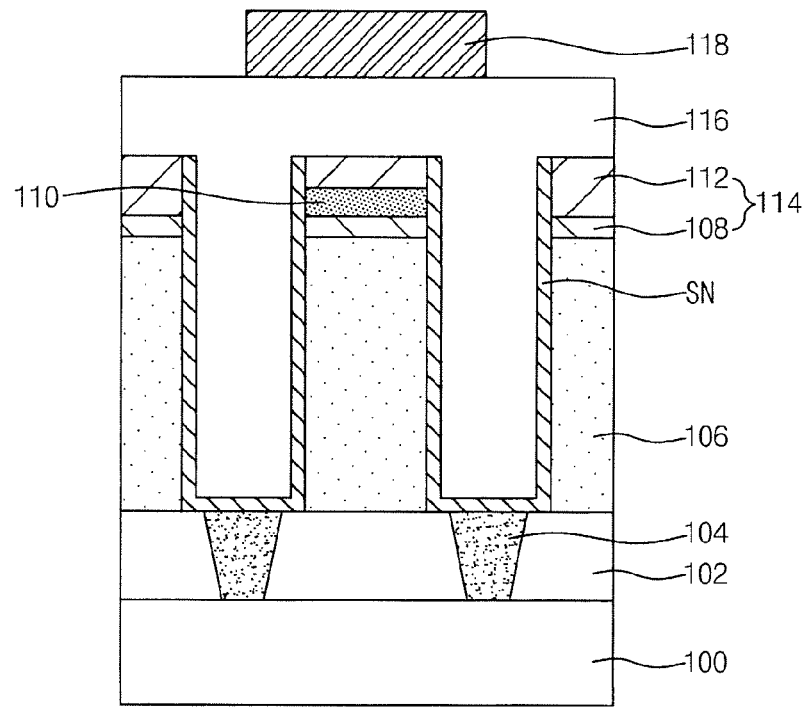

Referring to FIG. 3G, a capping layer 116 is shown formed on the support layer 114 including the storage nodes SN. The capping layer 116 is formed as a layer capable of preventing or minimizing the oxidation of the underlying storage nodes SN. One preferred embodiment is that the capping layer 116 may comprise, for example, an oxide layer. A mask pattern 118 is also shown formed on the capping layer 116 to form a support pattern for fixing the storage nodes SN.

Figure 3H:
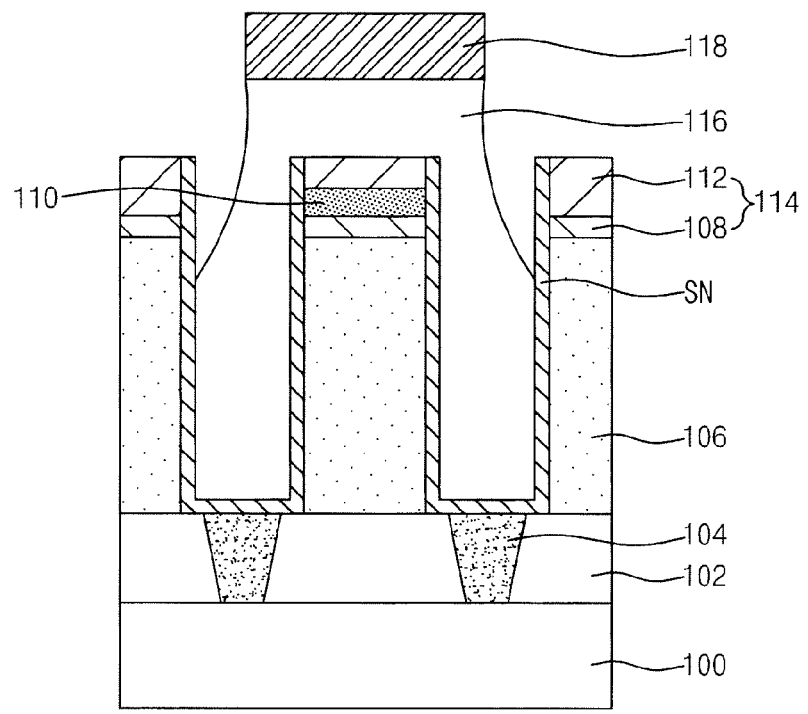

Referring to FIG. 3H, the capping layer 116 is shown selectively etched using the mask patterns 118 as an etch mask. Preferably etching of the capping layer 116 is implemented to expose only limited portions of the support layer 114.

Figure 3I:
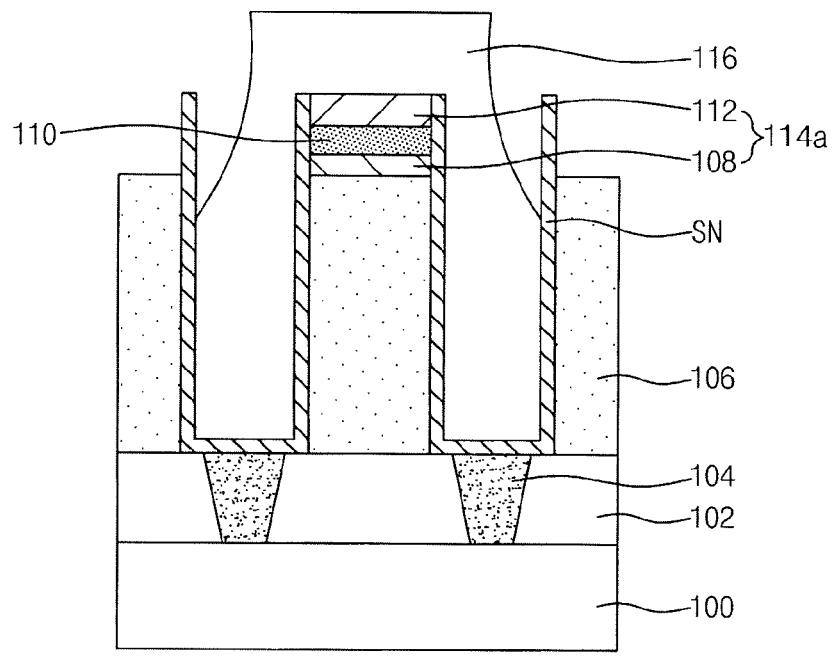

Referring to FIG. 3I, by removing the exposed portions of the support layer 114, a support pattern 114a that fixes together adjoining storage nodes SN is subsequently formed. Afterwards, the mask pattern 118 is removed. Here, the support pattern 114a has a structure in which the flowable insulation layer 110 is inserted between the first and second support layers 108 and 112. That is, it is preferable that the flowable insulation layer 110 buried within the support pattern 114a directly contacts the storage nodes SN.

Figure 3J:
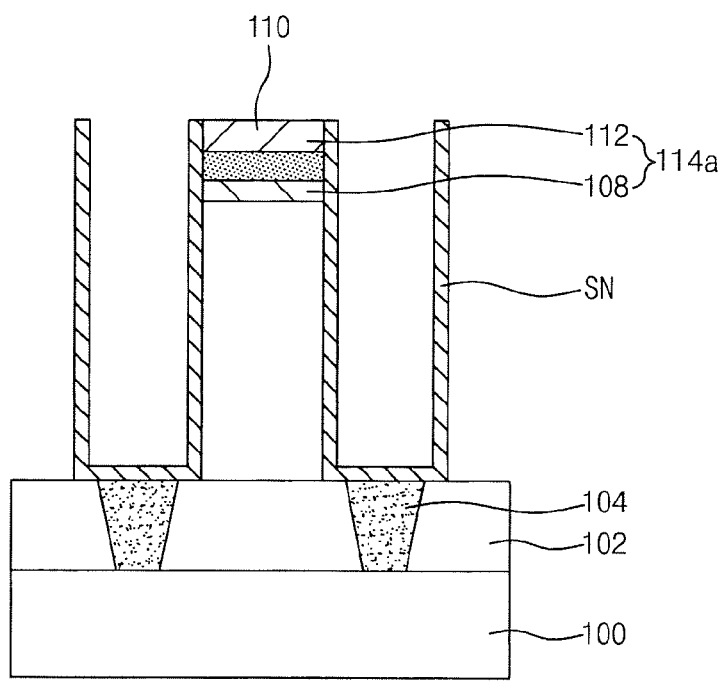

Referring to FIG. 3J, the exposed mold insulation layer 106 and the capping layer 116 remaining after the formation of the support pattern 114a are then removed. One preferred embodiment of removing the exposed mold insulation layer 106 and the capping layer 116 is implemented, for example, by using a wet dip-out process.

Thereafter, while not shown in the drawings, after forming a dielectric layer and plate nodes on the storage nodes including the support patterns, by sequentially conducting a series of well-known subsequent processes, the manufacture of a semiconductor device in accordance with any of the embodiments of the present invention is completed.

As is apparent from the above description, in the present invention, a support pattern for fixing storage nodes is formed to have a structure in which a flowable insulation layer is inserted. Here, the buried flowable insulation layer directly contacts the storage nodes.

Therefore, in the present invention, when conducting a dip-out process to remove any remaining exposed mold insulation layer having served as a mold for forming storage nodes, storage nodes can be fixed by the support pattern. Through this, in the present invention, the leaning phenomenon of the storage nodes can be effectively prevented or at least substantially avoided.

Further, in the present invention, even if cracks or other imperfections may occur between the support pattern and the storage nodes due to the stresses, such as those stresses induced in the support pattern when conducting the dip-out process and subsequently forming a dielectric layer, then the flowable insulation material of the flowable insulation layer inserted in the support pattern can subsequently flow into these cracks and fills the cracks, thereby removing the cracks can be achieved. Accordingly, in the present invention, the leakage of capacitance due to the presence of the cracks can be prevented or at least minimized. Therefore, the operational characteristics of a semiconductor device fabricated with any of these embodiments can be improved.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor device comprising:
   a plurality of storage nodes formed over a semiconductor substrate; and
   a support pattern with a void between the support pattern and the semiconductor substrate formed to fix to adjacent storage nodes such that the support pattern has a structure in which a flowable insulation layer is inserted between a first nitrode layer and a second nitride layer.

2. The semiconductor device according to claim 1, wherein adjacent storage nodes directly contact the flowable insulation layer buried within the support pattern.

3. The semiconductor device according to claim 1, wherein the flowable insulation layer of the support pattern comprises at least one of a borophosphosilicate glass (BPSG) layer and a phosphosilicate glass (PSG) layer.

4. The semiconductor device according to claim 1, wherein the flowable insulation layer is buried in the support pattern such that the flowable insulation layer is not exposed outside of thesupport pattern except where the flowable insulation layer directly contacts the adjacent storage nodes.

5. The semiconductor device according to claim 1, wherein storage node have shape of cylinder type.

6. The semiconductor device according to claim 1, wherein the semiconductor device further comprises:
   an interlayer dielectric formed over the semiconductor substrate; and
   a plurality of storage node contact plugs formed to contact with the storage node,
   wherein the void is formed between the support pattern and the interlayer dielectric.

* * * * *